(12) United States Patent
Kakutani

(10) Patent No.: US 7,096,912 B2
(45) Date of Patent: Aug. 29, 2006

(54) BONDING APPARATUS

(75) Inventor: Osamu Kakutani, Oume (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 10/808,845

(22) Filed: Mar. 25, 2004

(65) Prior Publication Data

US 2004/0188026 A1 Sep. 30, 2004

(30) Foreign Application Priority Data

Mar. 31, 2003 (JP) ............................... 2003-96241
Nov. 12, 2003 (JP) ............................. 2003-382890

(51) Int. Cl.
*B23Q 15/26* (2006.01)

(52) U.S. Cl. ...................... 156/358; 156/360; 156/378; 156/566; 228/4.5; 228/8; 228/12; 228/32; 228/45

(58) Field of Classification Search ................ 156/360, 156/358, 378, 566; 29/879, 739, 744, 740; 228/4.5, 27, 32, 45, 8, 12; 248/661, 649, 248/913, 662, 664
See application file for complete search history.

(56) References Cited

U.S. PATENT DOCUMENTS 5,556,022 A * 9/1996 Orcutt et al. ................. 228/1.1
6,059,169 A * 5/2000 Nihei et al. .................... 228/45

FOREIGN PATENT DOCUMENTS

JP 2002-329772 11/2002

OTHER PUBLICATIONS

Machine Translation of JP 2004-319958 (priority document).*

* cited by examiner

*Primary Examiner*—George Koch
(74) *Attorney, Agent, or Firm*—Koda & Androlia

(57) ABSTRACT

A bonding apparatus including, on a supporting stand 12, two linear motors 130 and 140 and a bonding head supporting stage 114 which supports the bonding head 120 by means of fluid pressure so that the bonding head 120 is movable in the horizontal plane. The linear motors 130 and 140 respectively include driving sections 132 and 142 and movable coil assemblies 134 and 144. An arm 136 extending from the movable coil assembly 134 of the first linear motor 130 is fastened to the bonding head 120, and an arm 146 extending from the movable coil assembly 144 of the second linear motor 140 is engaged with the bonding head 120. A driving force aimed at the center of gravity of the bonding head 120 is applied to the bonding head 120 via the arms 136 and 146, so that the bonding head 120 is moved.

9 Claims, 10 Drawing Sheets

BONDING APPARATUS

BACKGROUND OF THE INVENTION

1. Field of the Invention

The present invention relates to a bonding apparatus, and more particularly relates to a bonding apparatus equipped with a moving mechanism which moves the bonding part that performs bonding work to arbitrary positions.

2. Prior Art

In wire bonders or wire boding apparatus, a plurality of bonding pads disposed on a die such as a semiconductor chip, etc. are connected to bonding leads on a circuit board, etc. with slender metal wires, etc. In order to perform bonding with a slender metal wire, etc. by way of correctly positioning the wire in specified positions of the bonding pads and bonding leads, a mechanism that moves the bonding head on which a bonding tool (through which the metal wire is passed and held) and positioning camera are mounted is required.

FIG. 15 shows, in a top view, the moving mechanism of a bonding head 20 in a conventional wire bonder 10.

In this mechanism, known as a so-called XY table mechanism as described in Japanese Patent Application Laid-Open (Kokai) No. 2002-329772, an X table 16 and a Y table 18 are both provided in a stacked fashion on a table holding stand 14 which is on a supporting stand 12 of the wire bonder 10, and the bonding head 20 is fastened to the Y table 18. A bonding tool 22, which has (on its tip end) a capillary that holds a metal wire passing through this capillary, and a position detection camera 24, are attached to the bonding head 20. A circuit board conveying path 50 is provided on the supporting stand 12, and circuit boards are conveyed thereon so that the circuit boards are positioned in a bonding work region 52 that is located more or less directly beneath the bonding tool 22.

The bonding head 20 is moved to arbitrary positions in the XY plane by moving the X table 16 in the X direction and moving the Y table 18 in the Y direction on this X table 16; then, the position detection camera 24 detects the position of the bonding head 20, and the bonding tool 22 is moved into the desired position based upon this position detection. Then, bonding work is performed by moving the bonding tool in the Z direction by means of a Z direction moving mechanism which is not shown in the drawings.

Here, the X table 16 is driven by an X direction linear motor 30, and it is moved in the X direction on the table holding stand 14 while being guided by a linear guide not shown in the drawings. More specifically, the X direction linear motor 30 includes a drive section 32 and a movable coil 34; and the drive section 32 generates a driving magnetic field in the direction perpendicular to the coil, and the movable coil 34 through which a coil current is caused to flow receives the X direction driving force from the driving magnetic field. The movable coil 34 is connected to the X table 16 via an arm 36.

The Y table 18 is driven by a Y direction linear motor 40, and can be moved in the Y direction on the X table 16 while being guided by a linear guide (not shown). The Y direction linear motor 40 includes a drive section 42 and a movable coil 44; and the drive section 42 generates a driving magnetic field in the direction perpendicular to the XY plane, and the movable coil 44 through which a coil current is caused to flow receives the Y direction driving force from the driving magnetic field as a result of the X direction component current. The movable coil 44 is connected to the Y table 18 via an arm 46.

By way of using the XY table mechanism as described above, the bonding head is moved to arbitrary positions and bonding work is performed. However, this mechanism has several problems.

1. Since the bonding head is mounted on an X table and Y table that are superimposed in two tiers, the mass that must be driven for movement is not the mass of the bonding head alone; and the masses of the X table and Y table are also added. Thus, a heavy mass must be driven, and it is difficult to have a high moving speed bonding head.
2. Since the Y table and bonding head are moved in the Y direction on the X table, an offset or positional discrepancy generates between the driving direction of the X direction driving motor and the position of the center of gravity of the Y table and bonding head. As a result, a rotational force is generated with respect to the bonding head by this X direction driving force; and in order to prevent this, it is necessary to increase the rigidity of the guide mechanism such as the linear guides, etc. As a result, the mass increases even further, and this hinders any increase in the moving speed of the bonding head.
3. There are limits to how far the precision of the straightness of the linear guides that determines the movement precision in the X direction and the movement precision in the Y direction can be improved; and thus, it is difficult to achieve a further improvement in the positioning precision.
4. When the X table is moved, the Y table on top of the X table is also moved. In other words, the movable coil of the Y direction actuator is moved not only in the Y direction but also moved in the X direction. Accordingly, the magnet that is used to generate the driving magnetic field of the Y direction actuator is required to be increased in size in order to cover the movement range of this movable coil, and the cost of the apparatus increases.

In order to solve the problems, an expedient of forming the coil shape as a circular arc shape centered on the center of gravity of the bonding head has been proposed so as to reduce the offset between the direction of the driving force and the center of gravity. However, this results in more complicated structure. Furthermore, though a structure that accomplishes the connection between the Y direction actuator and the Y table by means of a joint connection instead of an arm can be used in order to reduce the size of the magnet, this causes a corresponding increase in the mass that must be driven. As a result, the size of the Y direction motor becomes larger in order to increase the Y direction driving force. Moreover, since a joint connection is used, a high rigidity cannot be obtained in these members. Furthermore, since the X table is moved, the center of the propulsion force of the Y direction actuator and the center of the load are offset, and it is difficult to increase the speed.

SUMMARY OF THE INVENTION

One object of the present invention is to solve the above-described problems encountered in the prior art.

It is another object of the present invention to provide a bonding apparatus that allows a greater increase in the moving speed of the bonding head.

It is still another object of the present invention to provide a bonding apparatus in which the positioning precision of the bonding head is further improved.

The above objects are accomplished by a unique structure of the present invention for a bonding apparatus that includes a bonding head, which performs bonding work on an object of bonding, and a moving mechanism, which moves the bonding head to arbitrary positions; and in the present invention, the moving mechanism comprises:

a first actuator that includes a first movable member, which is movable along a linear guide rotationally provided on a supporting stand, and a drive section, which drives the first movable member, and a second actuator that includes a second movable member, which is movable along a linear guide rotationally provided on a supporting stand, and a drive section, which drives the second movable member; and the first movable member is fastened at its one end to the bonding head, and the second movable member is shaft-supported at its one end by the bonding head.

In this structure, the first actuator can be structured so that the drive section and the linear guide that guides the first movable member are rotationally provided on the supporting stand as an integral unit, and the second actuator can be structured so that the drive section and the linear guide that guides the second movable member are rotationally provided on the supporting stand as an integral unit.

In the present invention, it is preferable that:

the first actuator be comprised of a first movable coil which is the first movable member, and the drive section of the first actuator is fastened to the supporting stand and includes a magnet that provides a magnetic flux linkage to the first movable coil; and the size of the first movable coil be set based upon conditions in which an amount of magnetic flux linkage, which is applied to the first movable coil by rotational and linear movements of the first movable coil, is free of changing; and further, the second actuator be comprised of a second movable coil which is the second movable member, and the drive section of the second actuator is fastened to the supporting stand and includes a magnet that provides a magnetic flux linkage to the second movable coil, and the size of the second movable coil be set based upon conditions in which an amount of magnetic flux linkage, which is applied to the second movable coil by rotational and linear movements of the second movable coil, is free of changing.

The above objects are accomplished by another unique structure of the present invention for a bonding apparatus that include a bonding head, which performs bonding work on an object of bonding, and a moving mechanism, which moves the bonding head to arbitrary positions; and in the present invention, the moving mechanism comprises a first actuator and a second actuator. The first actuator includes a first movable coil, which constitutes a first movable member rotationally provided on a slide stand that is movable along a linear guide fastened to a supporting stand, and a drive section, which includes a magnet for providing a magnetic flux linkage to the first movable coil and is fastened to the supporting stand; and the size of the first movable coil is set based upon conditions in which an amount of magnetic flux linkage that is applied to the first movable coil by rotational and linear movements of the first movable coil is free of changing. The second actuator includes a second movable coil, which constitutes a second movable member rotationally provided on a slide stand that is movable along a linear guide fastened to a supporting stand, and a drive section, which includes a magnet for providing a magnetic flux linkage to the second movable coil and is fastened to the supporting stand; and the size of the second movable coil is set based upon conditions in which an amount of magnetic flux linkage that is applied to the second movable coil by rotational and linear movements of the second movable coil is free of changing. In this structure, the first movable member is fastened at its one end to the bonding head, and the second movable member is shaft-supported at its one end by the bonding head.

In the bonding apparatuses of the present invention, it is preferable that an intersection point between a first straight line, which connects the center of rotation of the first movable member and a point at which the first movable member is connected to the bonding head, and a second straight line, which connects the center of rotation of the second movable member and a point at which the second movable member is connected to the bonding head, be set to coincide substantially with the center of gravity of the bonding head.

Furthermore, the bonding head is preferably supported on the supporting stand by fluid pressure; and the supporting stand can be a fluid pressure supporting stand that supports the bonding head by fluid pressure.

The supporting stand can be a suspension-supporting stand that supports the bonding head by suspension.

In addition, in the present invention, it is preferable that the bonding apparatus include a first sensor that detects the position of the first movable member, a second sensor that detects the position of the second movable member, a position calculating means that calculates a position of the bonding head as a position in an orthogonal coordinate system with respect to the supporting stand based upon detection data of the first sensor and detection data of the second sensor, and a control means that performs position control of the bonding head based upon the calculated position in the orthogonal coordinate system.

In the present invention, the first movable member and second movable member are directly connected to the bonding head. Thus, the bonding head is arranged so that the movement thereof is guided in the horizontal plane that includes the guidance axis of the linear guide that guides the movement of the first movable member and the guidance axis of the linear guide that guides the movement of the second movable member. In other words, the bonding head is directly driven by two actuators and can be moved arbitrarily in the horizontal plane. Accordingly, in the present invention, since the masses of an X table and Y table such as those used in conventional techniques are not included in the mass that must be driven, the moving speed of the bonding head increases to a greater extent.

Furthermore, in the present invention, the movement of the bonding head is accomplished by a rotational movement about the center of rotation of the first movable member and center of rotation of the second movable member, and the positioning precision of the bonding head in this case is governed mainly by the positional precision of the centers of rotation and the feeding precision of the actuators. Thus, the precision of the straightness of the linear guides has little effect, and the positioning precision of the bonding head improves further.

In addition, in the present invention, the drive sections of the actuators are provided so as to be free to rotate, and the movable members are caused to advance and retract along linear guides that are constructed as integral units with the drive sections. Accordingly, the bonding head can be directly driven and moved arbitrarily in the horizontal plane by using conventional guide-equipped linear motors as is, by supporting these motors on a supporting stand so that the motors are free to rotate, by fastening one of each of the movable members to the bonding head, and by shaft-supporting the other moving member. Besides movable coil type linear motors, stepping motors or motors that combine a direct-current motor and a ball screw shaft can be used as the guide-equipped linear motors.

In cases where actuators each having a movable coil that is movable along a linear guide rotatably provided on the supporting stand are used, and a drive section that is fastened to the supporting stand is used, the movable coils move obliquely with respect to the drive sections. In at least one of such two structures, the size of the movable coils is set based upon conditions which are such that the amount of magnetic flux linkage that is applied to the movable coils does not change according to the rotational or rectilinear movement of the movable coils. For example, the width of the movable coils is set sufficiently large relative to the width of the magnets of the drive sections so that the amount of magnetic flux linkage does not change even at the maximum inclination in the movement range of the movable coils. Accordingly, the size of the magnets of the drive sections can be kept small, and the cost can be set low.

In the present invention, with a use of two actuators each having a movable coil, which is provided so as to be free to rotate on a slide stand that is movable along a linear guide fastened to the supporting stand, and a drive section, which is fastened to the supporting stand, one movable member, i.e., the first movable member, and the other movable member, i.e., the second movable member, are directly connected to the bonding head. Thus, the bonding head is arranged so that the movement of the bonding head is guided in the horizontal plane that includes the guidance axis of the linear guide that guides the movement of the first movable member and the guidance axis of the linear guide that guides the movement of the second movable member. In other words, the bonding head is directly driven by two actuators and is movable arbitrarily in the horizontal plane. Accordingly, the masses of an X table and Y table such as those used in conventional techniques are not involved in the mass that must be driven, so that the moving speed of the bonding head increases to a greater extent.

Furthermore, in the present invention, the movement of the bonding head is accomplished by a rotational movement about the center of rotation of the first movable member and the center of rotation of the second movable member. Accordingly, the effect of the precision of the straightness of the linear guides on the positioning precision of the bonding head is reduced, and the positioning precision of the bonding head further increases.

With respect to the oblique movement of the movable coils relative to the drive sections, the size of the movable coils is set based upon conditions in which the amount of magnetic flux linkage that is applied to the movable coils by the rotational or rectilinear movement of the movable coils does not change, so that, for example, the width of the movable coils can be made sufficiently large relative to the width of the magnets of the drive sections. Accordingly, the size of the magnets of the drive sections can be small, and the cost can be low.

In the present invention, the offset between the direction of the driving force and the center of gravity of the bonding head can be reduced, and there is no need to increase the rigidity of the guide mechanism to a degree greater than it would otherwise be necessary in order to guarantee precision. Consequently, the weight of the guide mechanism such as the movable members, linear guides, etc. can be reduced. Accordingly, the moving speed of the bonding head increases even further.

Furthermore, in the present invention, since the bonding head is provided on the supporting stand by means of fluid pressure, the positioning precision of the bonding head further improves compared to cases that involves frictional sliding or rolling friction, etc. The air blowing ports and vacuum suction ports used for fluid pressure support can be installed on the bonding head or on the supporting stand.

In addition, in the present invention, the bonding working plane that includes the circuit board conveying mechanism and the movement plane of the bonding head can be separated. Thus, the degree of freedom of the layout of the overall bonding apparatus increases, and a more convenient bonding apparatus can be provided.

Furthermore, in the present invention, the movement of the bonding head about the centers of rotation of the movable members is converted into movement in an easy-to-use orthogonal coordinate system. Accordingly, by using this converted data, it is possible to use positioning control programs, etc. in conventional orthogonal coordinate systems "as is".

As seen from the above, in the bonding apparatus of the present invention, a high speed movement of the bonding head is assured, and the bonding apparatus has an improved positioning precision of the bonding head.

DETAILED DESCRIPTION OF THE INVENTION

Figure 1:
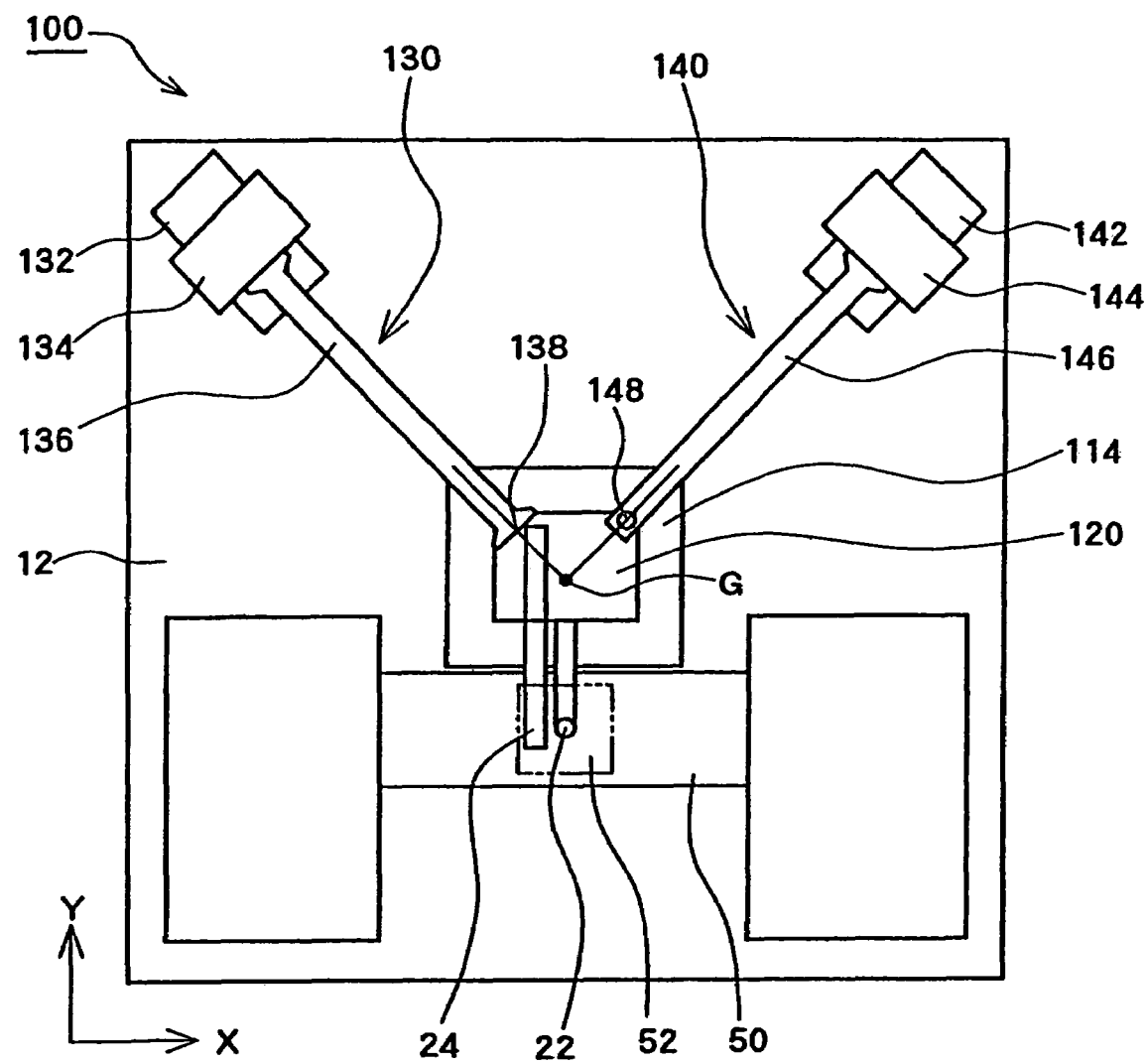
FIG. 1 is a top view of the wire bonder in an embodiment of the present invention, particularly showing the moving mechanism of the bonding head.
Figure 2:
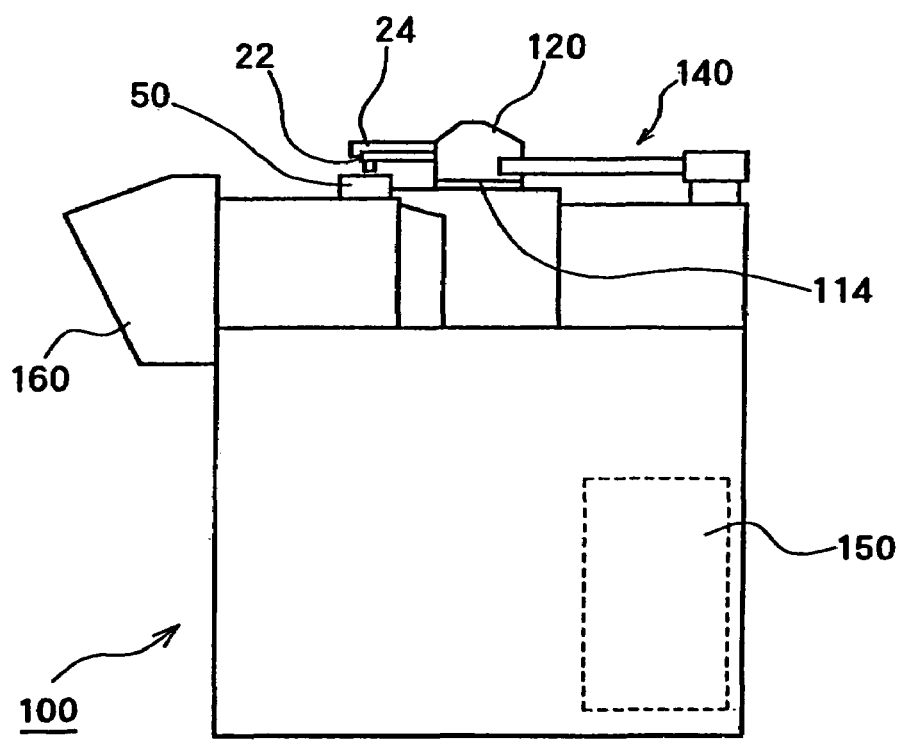
FIG. 2 is a side view of the wire bonder in an embodiment of the present invention.
Figure 15:
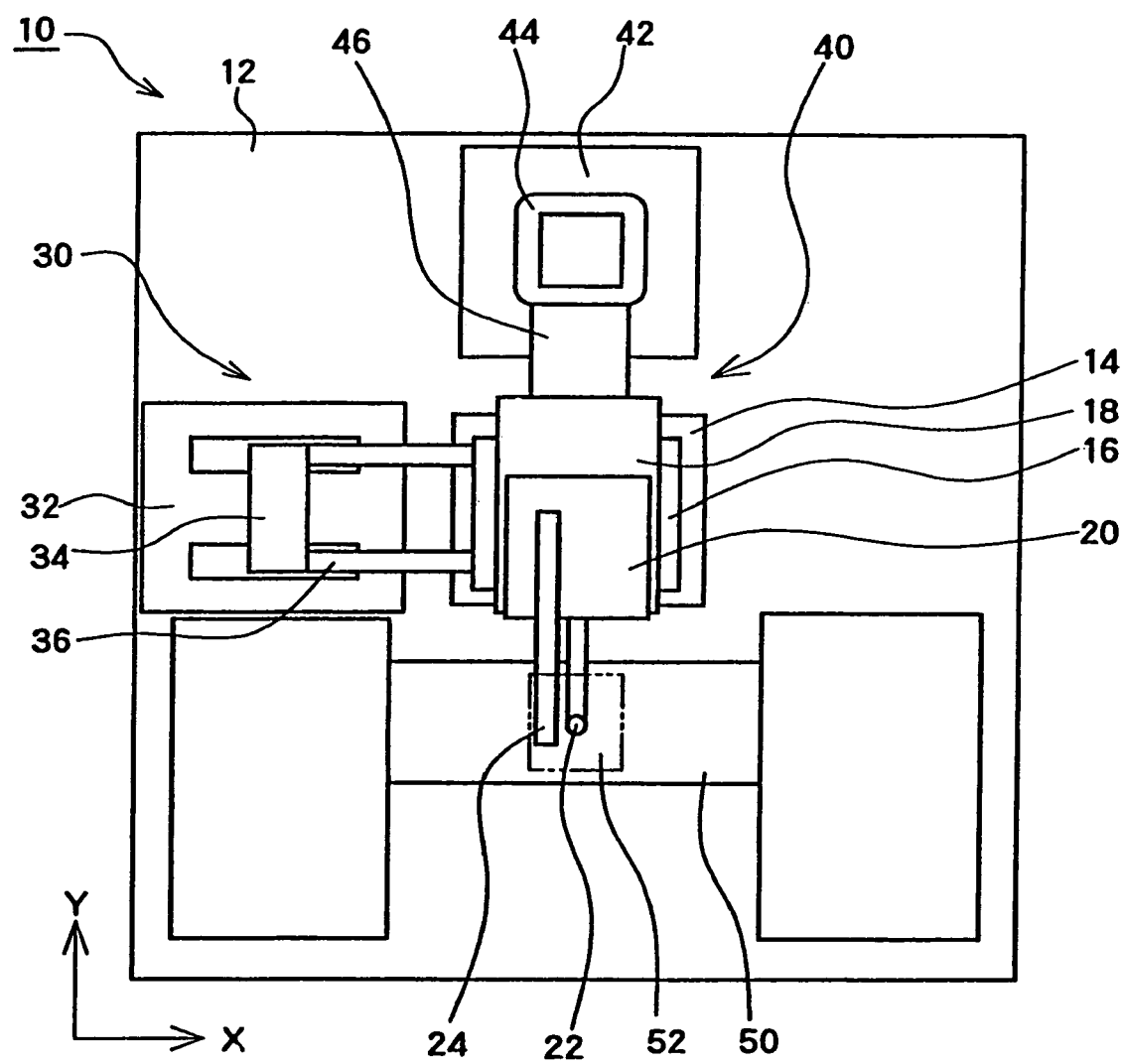
FIG. 15 is a top view of the moving mechanism of the bonding head in a conventional wire bonder.

Embodiments of the present invention will be described in detail below with reference to the accompanying drawings. In the following description, the bonding apparatus will be described as a wire bonder; however, the present invention is applicable to a bonding apparatus such as a die bonder, a facedown bonder, etc. FIG. 1 is a top view of the wire bonder 100; and in particular, it shows the moving mechanism of the bonding head 120. FIG. 2 shows the side the wire bonder 100. Elements that are the same as in FIG. 15 are labeled with the same reference numerals.

The wire bonder 100 includes, on a supporting stand 12, two (first and second) linear motors 130 and 140, a bonding head supporting stage 114 that supports the bonding head 120 by means of fluid pressure so that the bonding head 120 is movable horizontally, and a circuit board conveying path 50.

The bonding head 120 includes a bonding tool 22, which has a capillary (not shown) that holds a metal wire (that is passed through this capillary) on the tip end of the bonding tool 22, and a position detection camera 24. The bonding head 120 has a flat bottom surface. As will be described in detail later, the respective movable members of the two linear motors 130 and 140 are connected to the bonding head 120. Furthermore, a bonding working region 52 is set more or less directly beneath the bonding tool 22, and circuit boards are conveyed into this region via the conveying path 50. The bonding tool 22 can be moved in the Z direction which is perpendicular to the XY (horizontal) plane shown in FIG. 1 by a Z direction moving mechanism which is not shown in the drawings.

As shown in FIG. 2, a control section 150 and an operating panel 160 are installed in the wire bonder 100. The operating panel 160 is a panel board which is used to set the conditions required for wire bonding work. For example, in this operating panel 160, the required conditions can be input manually or by button settings, etc. The control section 150 is an electronic circuit block that controls the entire operation of the wire bonder 100. For instance, by executing operating software in accordance with the set conditions, the control section 150 controls the linear motors 130 and 140 and the fluid pressure support of the bonding head supporting stage 114, and it performs positioning control of the bonding head 120. All or part of the function of the control section 150 can be performed by hardware.

Of the two linear motors 130 and 140, the first linear motor 130 includes a drive section 132 and a movable coil assembly 134. The drive section 132 generates a driving magnetic field in the direction perpendicular to the XY plane; and the movable coil assembly 134, through which a coil current flows, receives the driving force from the driving magnetic field. An arm 136 is fastened at its base end to the movable coil assembly 134, and a tip end of this arm 136 is connected to the bonding head 120. The second linear motor 140 includes a drive section 142, which generates a driving magnetic field in the direction perpendicular to the XY plane, and a movable coil assembly 144. An arm 146 is fastened at its base end to the movable coil assembly 144, and a tip end of the arm 146 is rotatably connected to the bonding head 120.

The tip end of the arm 136 is fastened by, for instance fastening of bolts or tightening of screws, to a fixing end 138 of the bonding head 120. Alternatively, a joining technique such as adhesive bonding, etc. can be used. Furthermore, the bonding head 120 and arm 146 can be formed as an integral body.

The tip end of the arm 146 is connected to a shaft-supporting end 148 of the bonding head 120 using, for instance, a rotational bearing structure. In other words, a shaft (not shown) is provided on the bonding head 120, and an opening formed at the tip end of the arm 146 is engaged with this shaft loosely in its circumferentially direction, so that the tip end of the arm 146 is supported by the shaft in a rotatably fashion, thus being shaft-supported. Alternatively, a so-called cross pivot plate spring can be used. Such a cross pivot plate spring has four mutually perpendicular plate spring attachments around a central supporting portion; the central supporting point of the cross pivot plate spring is formed as the shaft-supporting end by attaching two of the plate spring attachments that extend in the same axial direction (e.g., the X direction) (among the total of four plate spring attachments) to one end of the arm 146 and by attaching the other two plate spring attachments that extend in the direction perpendicular to this (i.e., the Y direction) to the bonding head 120.

The first and second linear motors 130 and 140 are provided so that the intersection point between the arm 136 and arm 146 falls on the center of gravity G of the bonding head 120. Accordingly, a driving force aimed at the center of gravity G is applied to the bonding head 120 via the arms 136 and 146, so that the positional movement of the bonding head 120 is performed while being regulated by the movement of the arms 136 and 146.

The bonding head 120 is provided on the supporting stand 12 by means of fluid pressure. More specifically, air blowing and vacuum suction are performed between the upper surface of the bonding head supporting stage 114 of the supporting stand 12 and the bottom surface of the bonding head 120, so that the bonding head 120 is moved on the plane of the bonding head supporting stage 114 while being supported by fluid pressure.

Figure 3:
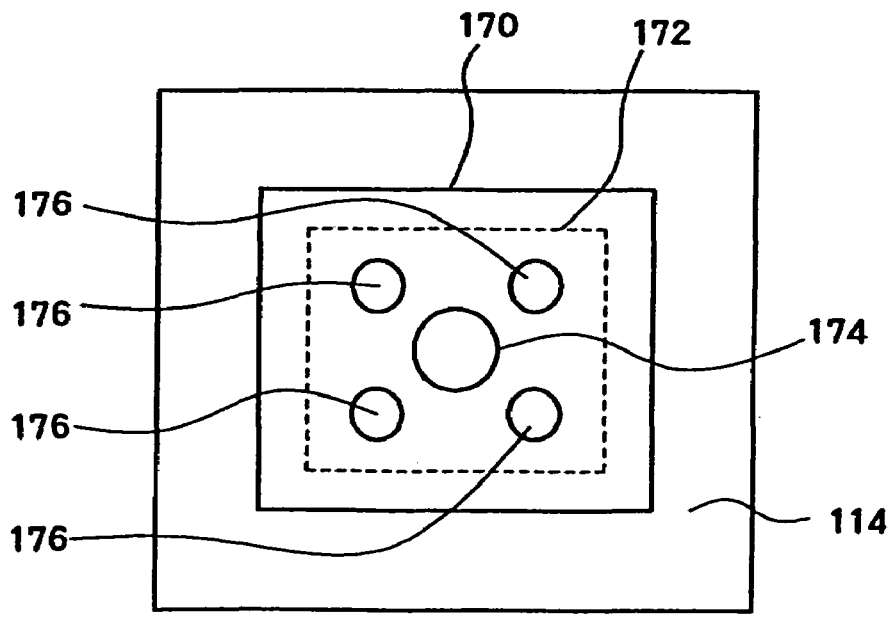
FIG. 3 shows how the bonding head is supported by means of fluid pressure in an embodiment of the present invention.

FIG. 3 shows the bonding head supporting stage 114 that faces the bottom surface of the bonding head 120.

Substantially at the center of a supporting region 170 that has been worked into a flat surface, a vacuum suction port 174 and four air blowing ports 176 that are provided around this vacuum suction port 174 are provided, so that a so-called air bearing structure is formed between the bonding head supporting stage 114 and the bonding head 120.

The vacuum suction port 174 and air blowing ports 176 are inside a movement region 172 of the bonding head 120 that is regulated by the movement of the arms 136 and 146. The vacuums suction port 174 is connected to a vacuum apparatus (not shown), and the air blowing ports 176 are connected to an air pressurization apparatus (not shown). Besides pressurizing and supplying air, the air pressurization apparatus can pressurize and supply some other gas such as nitrogen gas, etc.

The vacuum pressure and air pressure are controlled by the control section to appropriate values that cause the bonding head to float from the surface of the supporting region 170 and that make it possible to cause smooth movement of the bonding head by the movement of the arms 136 and 146. For example, assuming that the total mass of the bonding head is 1600 grams, then the (vacuum pressure× vacuum suction port area) is controlled to −50 N, and the (air pressure×air blowing port area) is controlled to +66 N.

Since the air blowing ports and vacuum suction port that are used for fluid pressure support are thus provided on the bonding head supporting stage 114 of the supporting stand 12, the bonding head 120 can be provided on the supporting stand 12 by means of fluid pressure. It is, however, also possible to provide the air blowing ports and vacuum suction port used for fluid pressure support on the bottom surface of the bonding head 120 and to form the air blowing holes as small holes.

Figure 4:
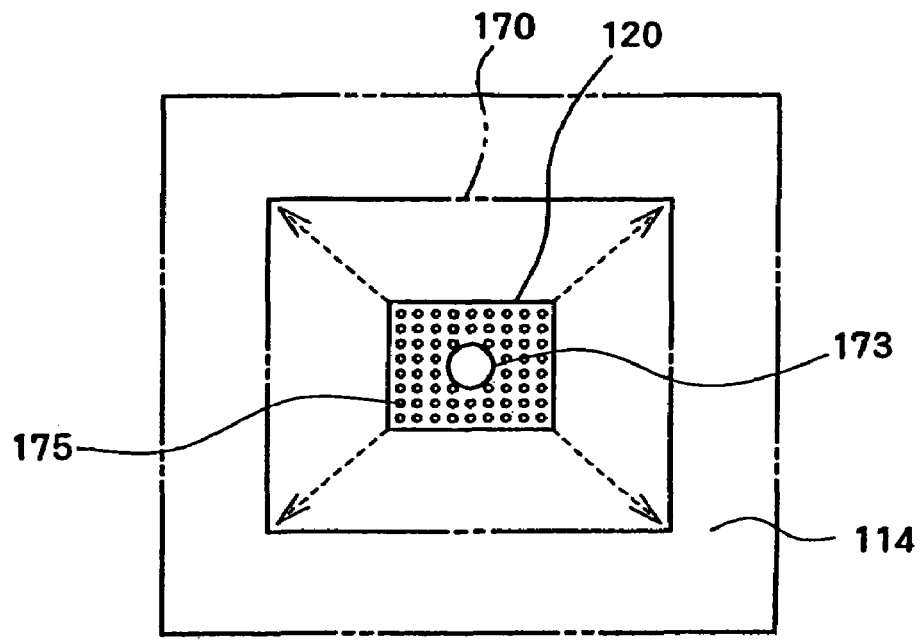
FIG. 4 shows another example of the fluid pressure support of the bonding head.

FIG. 4 illustrates the conditions of fluid pressure support between the bonding head 120 and the bonding head supporting stage 114 in a case where a vacuum suction port 173 and air blowing ports 175, small holes, are provided on the bottom surface of the bonding head 120.

The central portion of the bonding head supporting stage 114 makes the head supporting region 170 that is a flat surface. The bottom surface of the bonding head 120 is also a flat surface. This bottom surface is provided with a vacuum suction port 173, which is at substantially the center of the bottom surface, and a plurality of air blowing ports 175 provided around the vacuum suction port 173, so that a so-called air bearing structure is formed between the bottom surface and the bonding head supporting stage 114.

In regard to the air blowing ports 175, numerous holes, for example, with a diameter of 0.5 mm can be provided; or a material in which countless small holes are opened, such as a sintered metal or foamed metal, can be used as this portion; and air is blown from these small holes.

The vacuum suction port 173 is connected to a vacuum apparatus (not shown), and the air blowing holes 175 are connected to an air pressurization apparatus (not shown). Besides pressurizing and supplying air, the air pressurization apparatus can pressurize and supply some other gas such as nitrogen gas, etc.

The vacuum pressure and air pressure are set at appropriate values that cause the bonding head to float from the surface of the supporting region 170 and that make it possible to cause smooth movement of the bonding head by the movement of the arms 136 and 146.

Thus, since the vacuum suction port 173 and air blowing ports 175 are installed in the bonding head 120, the bonding head 120 can be smoothly moved while being supported by means of fluid pressure throughout the entire head supporting region 120 as indicated by broken lines in FIG. 4.

Figure 5:
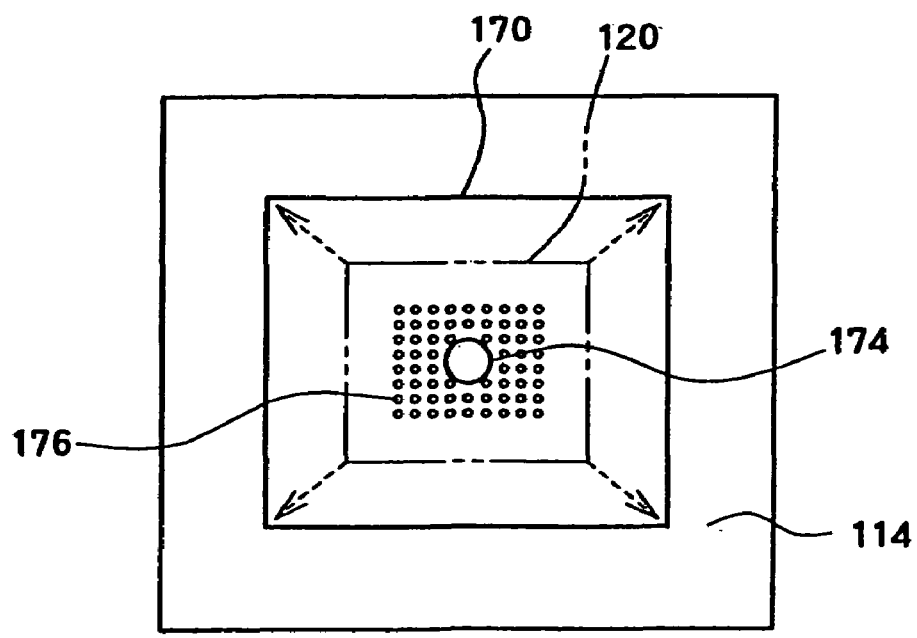
FIG. 5 shows still another example of the fluid pressure support of the bonding head.

FIG. 5 illustrates an example in which the vacuum suction port 174 and air blowing ports 176, small holes, are provided on the bonding head supporting stage 114.

In this example of FIG. 5, the vacuum piping and air piping can be fastened and provided on the supporting stand side, which is an advantage. On the other hand, the movement range of the bonding head 120 is limited so that the bottom surface of the bonding head 120 does not leave the vacuum suction port 174 and air blowing ports 176. In other words, as seen from FIG. 5, the region where the vacuum suction port 174 and air blowing ports 176 are provided is narrow relative to the size of the bottom surface of the bonding head 120, and thus the movement range of the bonding head 120 is limited as indicated by broken lines (which are shorter than those in FIG. 4) in FIG. 5.

Figure 6:
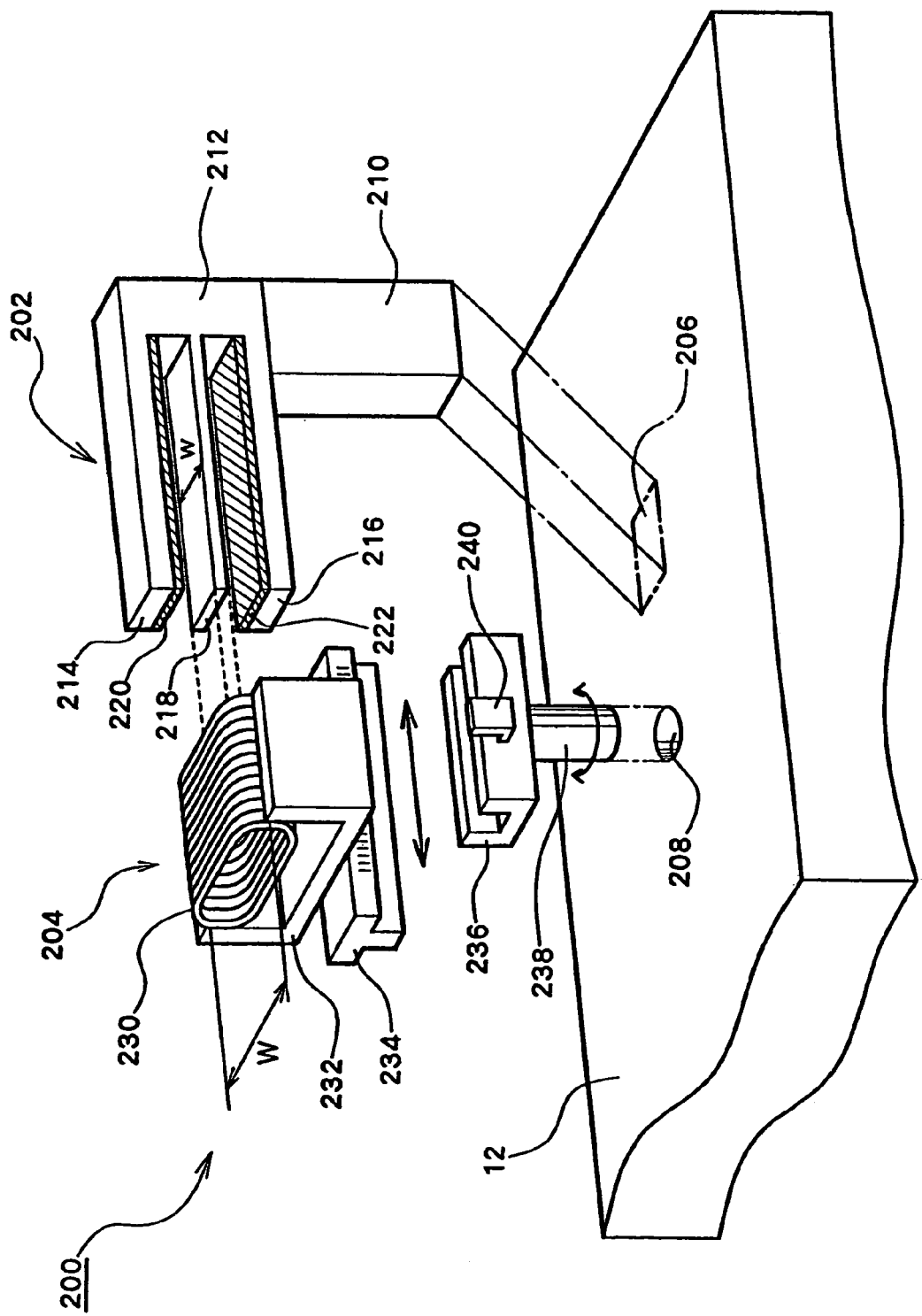
FIG. 6 is a detailed view of the common elements of the first linear motor and second linear motor in an embodiment of the present invention.

FIG. 6 shows the respective elements that form the common elements 200, i.e., the drive sections and movable coil assembly, which are common to both the first linear motor 130 and second linear motor 140.

In the common elements 200 of the linear motors 130 and 140, the drive sections 202 are fastened to drive section fastening portions 206 (only one shown) of the supporting stand 12, and the movable coil assembly 204 are attached to rotation holes 208 in the supporting stand 12 via intervening parts. The fastening between the drive sections 202 and supporting stand 12 in the drive section fastening portions 206 is accomplished by, for instance, a fastening means such as bolt fastening, screw tightening, bonding, etc. The drive sections 202 can be provided on the supporting stand 12 while eliminating any reaction movement by way of using the spaces between drive sections 202 and supporting stand 12 as separate rectilinear guides.

The drive sections 202 have the function to generate a driving magnetic field that is supplied to the movable coils; and each of the drive sections 202 includes a leg 210, which is a columnar member fastened to the drive section fastening portion 206, and a yoke 212, which is attached to the upper portion of the leg 210. The yoke 212 is a magnetic member and is comprised of an upper yoke portion 214, a lower yoke portion 216 and a central yoke portion 218 that form an E shape. An upper magnet 220 is attached to the undersurface of the upper yoke portion 214, and a lower magnet 222 is attached to the upper surface of the lower yoke portion 126. Except for the upper magnet 220 and lower magnet 222, the same materials are used for the leg 210 and yoke 212, and these elements can be formed as an integral unit.

Each movable coil assembly 204 is an assembled body that includes a hollow coil 230, a supporting member 232 that holds the hollow coil 230, a guide 234 that is fastened to the supporting member 232, a guide groove member 236 which has a groove that allows the guide 234 to slide therein, and a rotating shaft 238 fastened to the guide groove member 236 and is loosely provided in the rotating hole 208 formed in the supporting stand 12. The guide 234 and the guide groove member 236 form a "linear guide" that is provided on the supporting stand 12 and rotatable about the rotating shaft 238. Accordingly, the hollow coil 230 makes a rectilinear motion while being guided by the linear guide and makes a rotational motion together with the linear guide, with the rotating hole 208 formed in the supporting stand 12 as the center of such rotation. The arms 136 and 146 that are connected to the bonding head are attached by being fastened to the supporting members 232.

In the rotational mechanism formed by a combination of rotating holes and rotating shafts, a rotational bearing structure can be used. An air bearing structure can be used, and a cross pivot plate spring can be used as well.

A position detection sensor 240 is attached to the guide groove member 236, so that the position of the hollow coil 230 on the linear guide is detected. Since the movement of the hollow coil 230 along the linear guide represents the movement of the arm along the linear guide, the movement of the bonding head connected to the arm can be controlled based upon the detection data of the position detection sensor 240. The position detection sensor 240 also detects the position of the guide groove member 236 provided on the side of the guide 234.

The hollow coil 230 is of a type in which a conductor such as a copper wire, etc. is wound in a plurality of turns. The size of this coil is selected such that the wound coil is accommodated in the gap between the upper magnet 220 and the central yoke portion 218 and in the gap between the central yoke portion 218 and the lower magnet 222. Accordingly, the driving magnetic field that is generated by the drive section 202 is linked with the hollow coil 230, so that the hollow coil 230 is driven in its axial direction by causing an electric current to flow through the conductor under the control of the control section.

As described above, each movable coil assembly 204 can be moved along a corresponding linear guide that is provided on the supporting stand 12 so that the linear guide is free to rotate as shown by the curved arrow in FIG. 6. Accordingly, each movable coil assembly 204 is movable obliquely with respect to the drive section 202. In order to ensure that the amount of magnetic flux linkage does not change even at the maximum inclination in the movement range of the movable coil assembly 204, the width W of the hollow coil is set so that this width is sufficiently larger relative to the width w of the magnet of the drive section 202. Accordingly, the size of the magnet can be set at a minimum size required for the driving force in spite of the inclined movement of the movable coil assembly 204.

Figure 7:
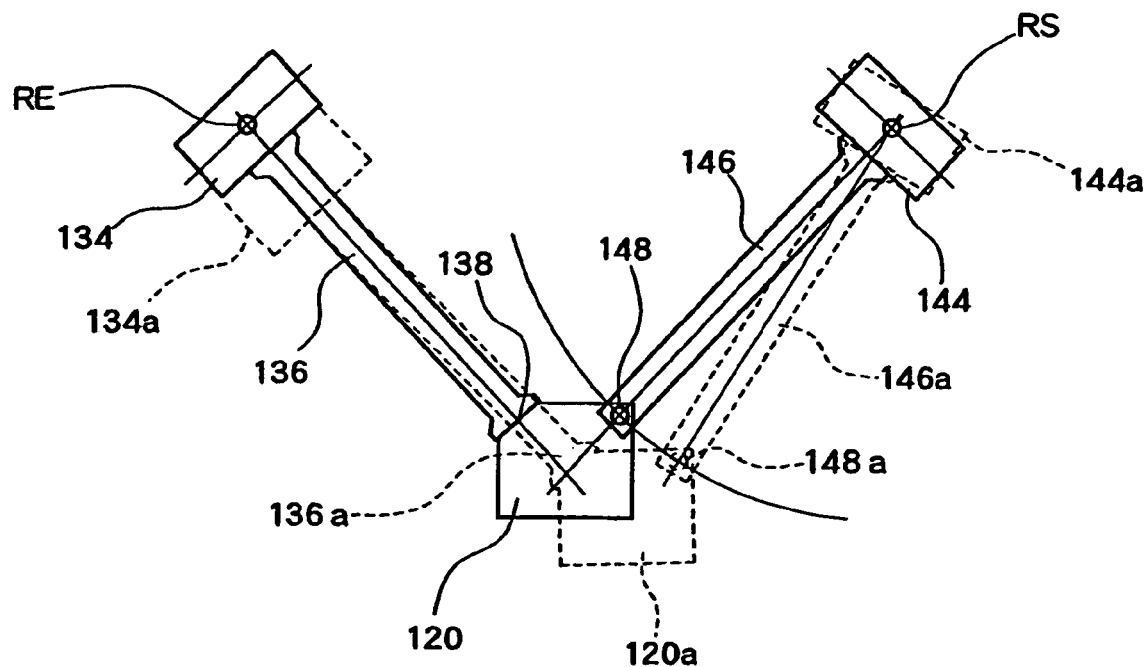
FIG. 7 illustrates the movement track of the bonding head in an embodiment of the present invention.
Figure 8:
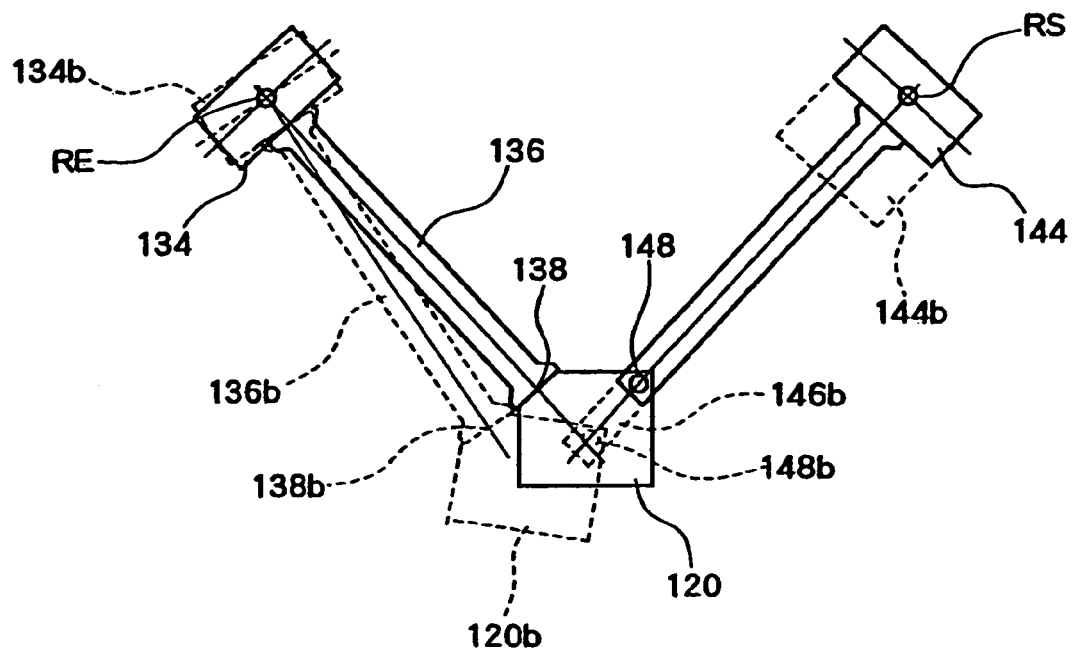
FIG. 8 illustrates the movement track of the bonding head in an embodiment of the present invention.

FIGS. 7 and 8 illustrate the movement of the bonding head 120 in a case where the first linear motor 130 and second linear motor 140 that have the common elements 200 shown in FIG. 6 are used. In FIGS. 7 and 8, elements that are the same as in FIG. 1 are labeled with the same reference numerals, and a detailed description of such elements is omitted.

Furthermore, in FIGS. 7 and 8, only the movable coil assemblies 134 and 144, the arms 136 and 146 and elements around the bonding head 120 are shown. The center of rotation of the movable coil assembly 134 is indicated by RE, and the center of rotation of the movable coil assembly 144 is indicated by RS. In addition, the solid lines indicate the initial state prior to the driving of the first and second linear motors. The broken lines in FIG. 7 indicate the state after the driving of only the first linear motor, and the broken lines in FIG. 8 indicate the state after the driving of only the second linear motor. A distinction is made by adding "a" or "b" to the reference numerals of the respective elements after the driving.

In FIG. 7, when only the first linear motor is driven without driving the second linear motor, the second movable coil assembly 144 and arm 146 are allowed only to rotate about the center of rotation RS. In other words, assuming that the first movable coil assembly 134 receives a driving force in the direction that pushes the bonding head 120, since the relative positional relationship between the fixing end 138 and shaft-supporting end 148 of the bonding head 120 is invariable, the fixing end 138 of the bonding head 120 is moved, while this invariable relationship is maintained, along a circular arc centered on the center of rotation RE, and thus the shaft-supporting end 148 is moved along a circular arc centered on the center of rotation RS. These movements are shown by the broken lines. Though the arm 136 is rotated slightly, in cases where the length of the arm 136 is sufficiently long compared to the length of the bonding head 120, the amount of this rotation is slight and negligible, and it is not hindered that respective points (e.g., the center of gravity) on the bonding head 120 make a rotational movement that is more or less centered about the center of rotation RS, and thus the bonding head 120 is moved.

On the other hand, as seen from FIG. 8, when only the second linear motor is driven without driving the first linear motor, the first movable coil assembly 134 and arm 136 are allowed only to rotate about the center of rotation RE. In other words, assuming that the second movable coil assembly 144 receives a driving force in the direction that pushes the bonding head 120, since the relative positional relationship between the fixing end 138 and shaft-supporting end 148 of the bonding head 120 is invariable, the fixing end 138 of the bonding head 120 is moved, while this invariable relationship is maintained, along a circular arc centered on the center of rotation RE, and thus the shaft-supporting end 148 is moved along a circular arc centered on the center of rotation RS. These movements are shown by the broken lines. Though the arm 146 is rotated slightly, in cases where the length of the arm 146 is sufficiently long compared to the length of the bonding head 120, the amount of this rotation is slight and negligible, and it is not hindered that respective points (e.g., the center of gravity) on the bonding head 120 make a rotational movement centered about the center of rotation RE, and thus the bonding head 120 is moved.

Figure 9:
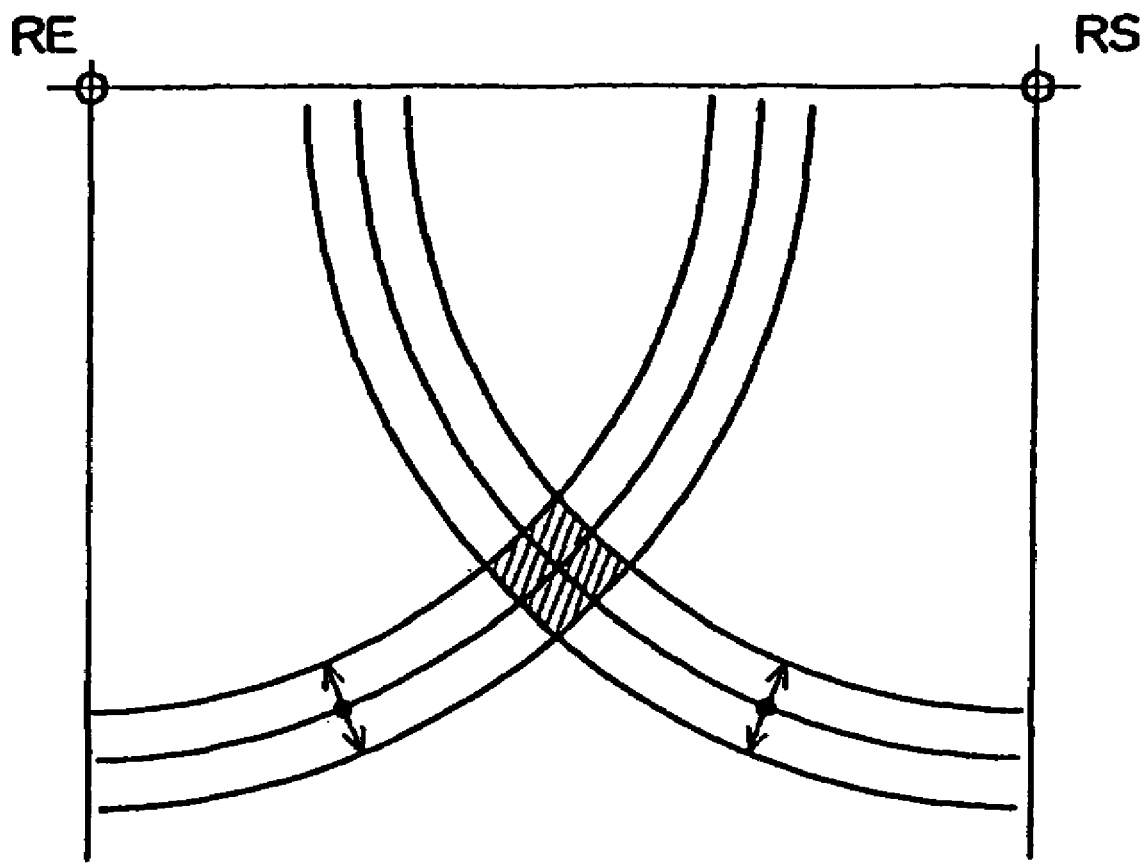
FIG. 9 illustrates the movement track of the bonding head in an embodiment of the present invention.

FIG. 9 shows the movement track of the center of gravity of the bonding head caused by the driving of the first linear motor and the movement track of the center of gravity of the bonding head caused by the second linear motor, with these movement tracks superimposed.

The movement track of the center of gravity of the bonding head caused by the driving of the first linear motor is a circular arc that is more or less centered on the center of rotation RS, while the movement track of the center of gravity of the bonding head caused by the second linear motor is a circular arc that is more or less centered on the center of rotation RE. The area where these tracks overlap in the movement ranges of the first linear motor and second linear motor (i.e., the area indicated by shading in FIG. 9) is the range in which the movement of the center of gravity of the bonding head can be controlled.

Here, if the track of the intersection point between the direction of the driving force generated by the first linear motor and the direction of the driving force generated by the second linear motor is examined, it is seen that this track more or less coincides with the center of gravity of the bonding head. More specifically, as seen from FIG. 9, if the distance from the center of rotation RS or RE to the bonding head, i.e., the length of each arm, is set at a sufficiently large value compared to the movement range of the bonding head, then the track of the intersection point between a straight line that connects the center of rotation RE of the first movable coil assembly and the fastening point in the bonding head and a straight line that connects the center of rotation RS of the second movable coil assembly and the shaft-supporting point in the bonding head coincide substantially with the position of the center of gravity of the bonding head.

Figure 10:
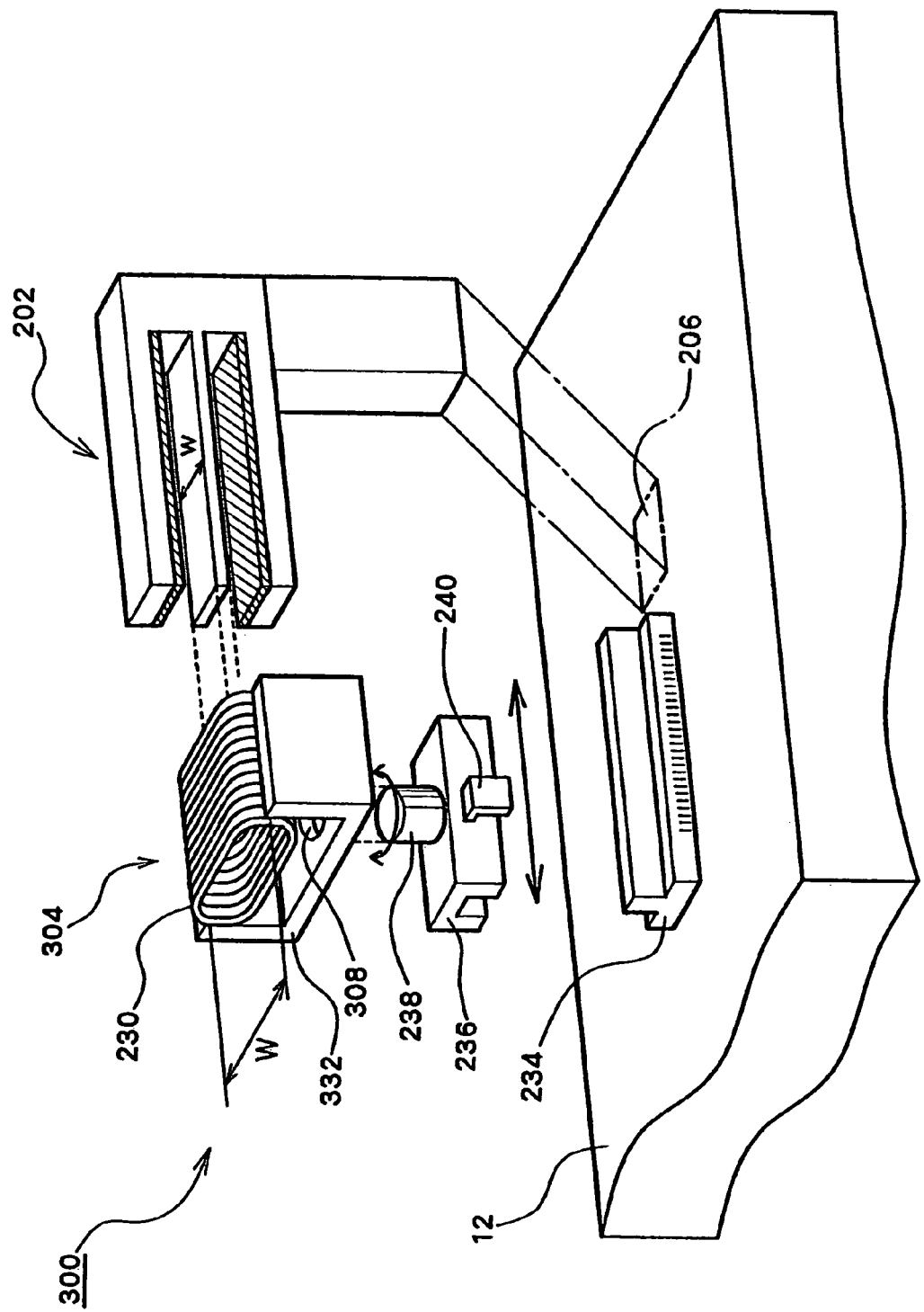
FIG. 10 is a detailed view of the common elements of the first linear motor and second linear motor in another embodiment of the present invention.

FIG. 10 illustrates another example of the construction of the common elements to the first linear motor 130 and second linear motor 140. Elements that are the same as in FIG. 6 are labeled with the same reference numerals, and a detailed description of such elements is omitted. In the common elements 300 shown in FIG. 10, the drive sections 202 have exactly the same construction as that shown in FIG. 6; and only the relationship of the movable coil assembly 304 with respect to the supporting stand 12 differs from that shown in FIG. 6.

More specifically, each movable coil assembly 304 is an assembled body that includes a hollow coil 230, a supporting member 332 which supports the hollow coil 230 and has a rotating hole 308, a guide groove member 236 to which a rotating shaft 238 that loosely engages with the rotating hole 308 is attached in an upward-facing attitude and which has a downward-facing guide groove, and a guide 234 which is fastened to the supporting stand 12 and on which the guide groove member 236 slide with its downward-facing guide groove.

In other words, the above elements are assembled in the order of the hollow coil 230—supporting member 332—rotating hole 308—rotating shaft 238—guide groove member 236—guide 234 and supporting stand 12; and thus the elements in the structure of FIG. 10 are substantially in reverse in the vertical direction compared to the structure shown in FIG. 6. The position detection sensor 240 is provided on the guide 234, and it can be provided on the guide groove member 236. For the rotational mechanism between the rotating hole and rotating shaft, a rotational bearing structure can be used; alternatively, an air bearing structure or a structure that uses a cross pivot plate spring can be employed.

In the structure described above, the guide 234 and guide groove member 236 form a "linear guide" that is fixed with respect to the supporting stand 12, and the hollow coil 230 is provided so that this coil is free to rotate with respect to the guide groove member. In other words, the hollow coil 230 makes a rectilinear movement while being guided by the fixed linear guide and makes a rotational movement with the rotating shaft 238 (which is provided on the guide groove member 236 that moves along the linear guide) as the center of rotation. In other words, the fact that the center of rotation of the movable coil assembly is moved as the linear motor is driven differs from the structure for the common elements 200 shown in FIG. 6.

In the structure of FIG. 10, since the position of the center of rotation of each movable coil is provided in a fixed position with respect to the hollow coil, the center of rotation of the movable coil assembly and the position of the center of gravity of the movable coil assembly as a whole including the arm coincide with each other. As a result, the movable coil assembly as a whole including the arm is caused to rotate more smoothly than in a case where the center of gravity of the movable coil assembly including the arm does not coincide with the center of rotation but rather has an offset.

Figure 11:
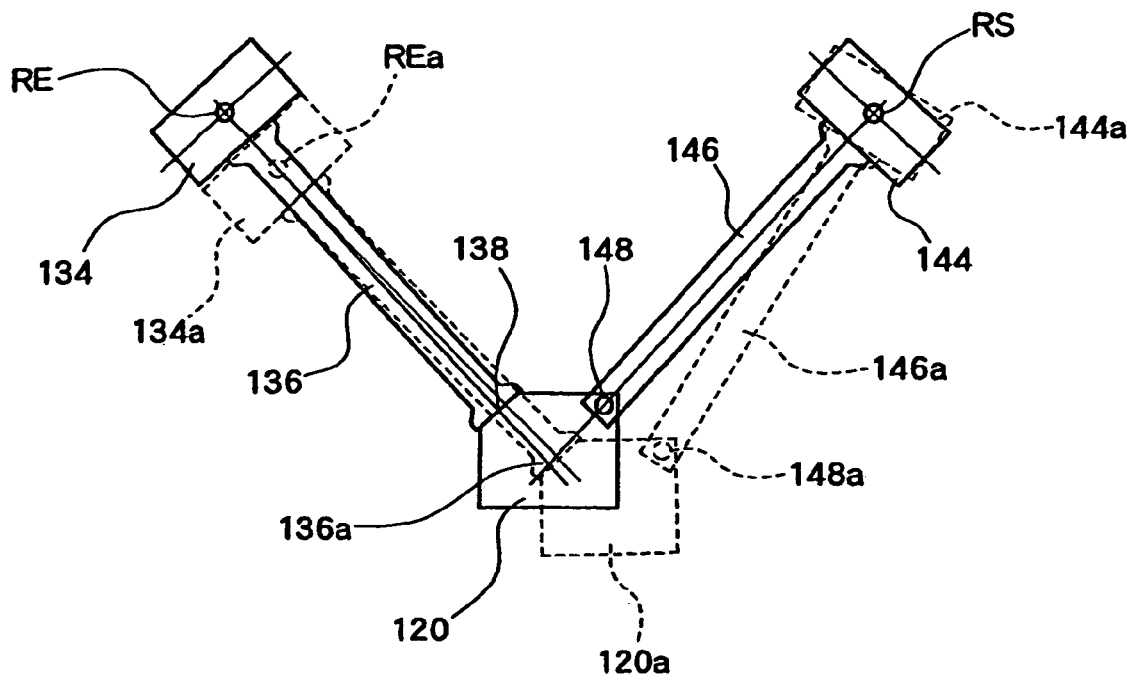
FIG. 11 illustrates the movement track of the bonding head in another embodiment of the present invention.
Figure 12:
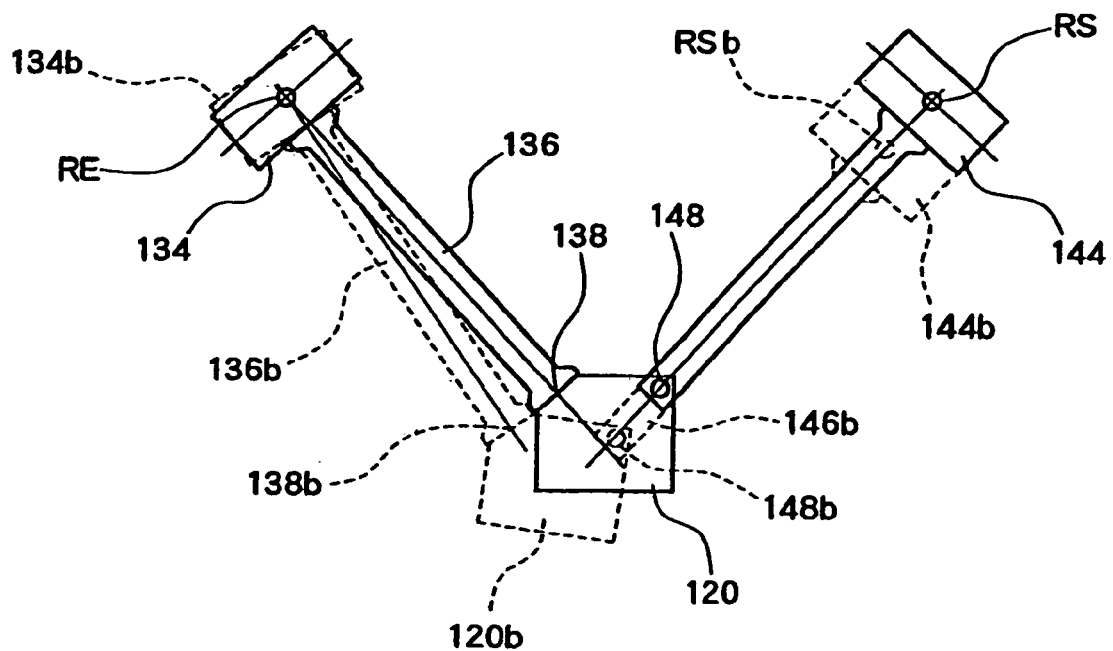
FIG. 12 illustrates the movement track of the bonding head in another embodiment of the present invention.

FIGS. 11 and 12 illustrate the movement of the bonding head 120 in which the first linear motor 130 and second linear motor 140 that have the common elements 300 shown in FIG. 10 are provided. The manner of expression and assignment of reference numerals to the respective elements shown in FIGS. 11 and 12 are the same as in FIGS. 7 and 8, and a description thereof is avoided.

In FIG. 11, when the second linear motor is not driven, and only the first linear motor is driven, the second movable coil assembly 144 and arm 146 are allowed only to rotate about the center of rotation RS. In other words, assuming that the first movable coil assembly 134 receives a driving force in the direction that pushes the bonding head 120, the first movable coil assembly 134 is moved to a position shown by the reference numeral 134a by this driving, and the center of rotation RE is moved to a position shown by the reference numeral REa. Since the relative positional relationship between the fixing end 138 and shaft-supporting end 148 of the bonding head 120 is invariable, the fixing end 138 of the bonding head 120 is moved, while this invariable relationship is maintained, along a circular arc centered on the moved center of rotation REa, and thus the shaft-supporting end 148 is moved along a circular arc centered on the center of rotation RS. These movements are shown by the broken lines. Thought the arm 136 is rotated slightly, in cases where the length of the arm 136 is sufficiently long compared to the length of the bonding head 120, the amount of this rotation is slight and negligible, and it is not hindered that respective points on the bonding head 120 (e.g., the center of gravity) make a rotational movement that is more or less centered about the center of rotation RS, and thus the bonding head 120 is moved.

On the other hand, as seen from FIG. 12, when the first linear motor is not driven, and only the second linear motor is driven, then the first movable coil assembly 134 and arm 136 are allowed only to rotate about the center of rotation RE. In other words, assuming that the second movable coil assembly 144 receives a driving force in the direction that pushes the bonding head 120, the second movable coil assembly 144 is moved to a position shown by the reference numeral 144b by this driving, and the center of rotation RS is moved to a position shown by the reference numeral RSb. Since the relative positional relationship between the fixing end 138 and shaft-supporting end 148 of the bonding head 120 is invariable, the fixing end 138 of the bonding head 120 is moved, while this invariable relationship is maintained, along a circular arc centered on the center of rotation RE, and the shaft-supporting end 148 is moved along a circular arc centered on the center of rotation RSb. These movements are shown by the broken lines. Though the arm 146 is rotated slightly, in cases where the length of the arm 146 is sufficiently long compared to the length of the bonding head 120, the amount of this rotation is slight and negligible, it is not hindered that respective points on the bonding head 120 (e.g., the center of gravity) make a rotational movement about the center of rotation RE, and thus the bonding head 120 is moved.

Figure 13:
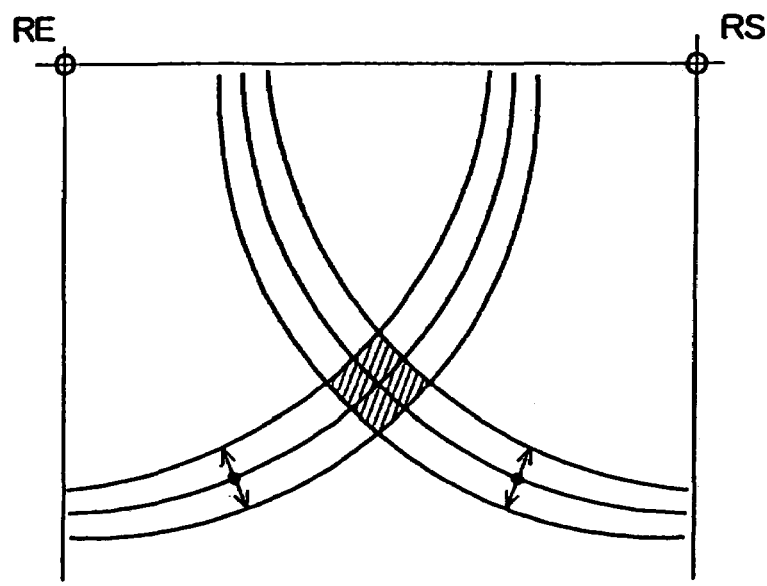
FIG. 13 illustrates the movement track of the bonding head in another embodiment of the present invention.

FIG. 13 shows the movement track of the center of gravity of the bonding head caused by the driving of the first linear motor, and the movement track of the center of gravity of the bonding head caused by the second linear motor, with these movement tracks superimposed.

The movement track of the center of gravity of the bonding head caused by the driving of the first linear motor is a circular arc about the center of rotation RSb after the movement caused by driving (rather than a circular arc about the initial center of rotation RS), and the movement track of the center of gravity of the bonding head caused by the second linear motor is also a circular arc about the center of rotation REa after the movement caused by driving (rather than a circular arc about the initial center of rotation RE).

Accordingly, the shape of the circular arcs differs from the one shown in FIG. 9. The area where these tracks overlap in the movement ranges of the first linear motor and second linear motor (i.e., the area indicated by shading in FIG. 13) is the range in which the movement of the center of gravity of the bonding head can be controlled. In regard to the movement within this range, the track of the intersection point between the direction of the driving force of the first linear motor and the direction of the driving force of the second linear motor more or less coincides with the center of gravity of the bonding head.

Thus, since the track of respective points such as the center of gravity, etc., in the bonding head is expressed by the intersection point between circular arcs about two centers of rotation, conversion into a commonly used orthogonal coordinate system is convenient. By installing such conversion software in the control section, it is possible to use bonding head positioning control programs, etc., in conventional orthogonal coordinate system "as is".

In the above description, a combination of the first linear motor and second linear motor having the common elements 200 and a combination of the first linear motor and second linear motor having the common elements 300 is described. The first linear motor can be a linear motor that has the above-described common elements 200, and the second linear motor can be a linear motor that has the above-described common elements 300. Alternatively, the first linear motor can be a linear motor that has the above-described common elements 300, and the second linear motor can be a linear motor that has the above-described common elements 200.

In the common elements 200 shown in FIG. 6, the linear guide is a separate element from the drive section 202. However, the drive section and the linear guide that guides the hollow coil can be supported as an integral unit on the supporting stand so that this integral unit is free to rotate. In this structure, the drive section of the linear motor is provided on the supporting stand so that this drive section is free to rotate, and the hollow coil is caused to advance and retract along the linear guide that is constructed as an integral unit with the drive section; accordingly, a conventional guide-equipped linear motor can be employed "as is" on the supporting stand in a manner that this motor is free to rotate. Furthermore, in the structure in which the guide-equipped linear motor is provided on a supporting stand so that this motor is rotatable, the movable element does not need to be a movable coil; and a stepping motor or a combination of a direct-current motor and a ball screw shaft can be employed.

Figure 14:
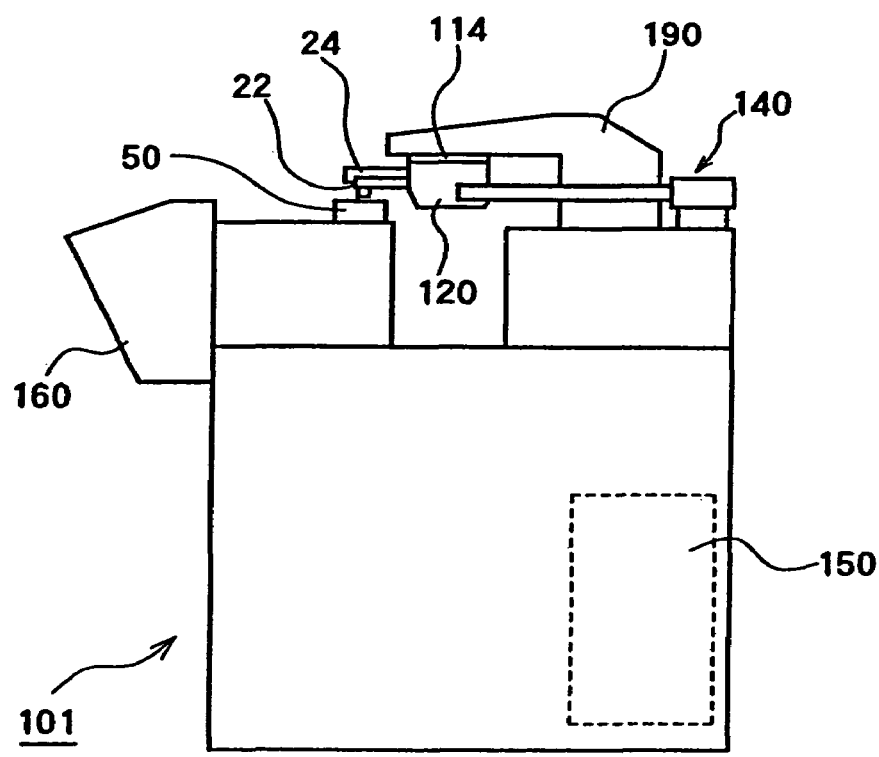
FIG. 14 is a side view of a wire bonder that uses a suspension supporting stand that supports the bonding head by suspension in another embodiment.

FIG. 14 shows the side of a wire bonder 101 that uses a suspension supporting stand 190 which supports the bonding head 120 by suspension.

A bonding head supporting stage 114 is provided so as to face downward on the supporting stand 190 so as to face the upper surface of the bonding head 120, and the bonding head 120 is supported by a balance of vacuum pressure and air pressure as described in FIGS. 3 through 5. In this construction, since the bonding working plane and the movement plane of the bonding head are separated from each other, the degree of freedom of the layout of the wire bonder increases.

As seen from the above, in the bonding apparatus of the present invention, the bonding head 120 is directly driven by a first linear motor 130 and second linear motor 140 via two arms 136 and 146 and is moved arbitrarily in the horizontal plane in any direction. In other words, the two driving sources for the bonding head 120 can be provided independently of each other regardless of the mutual mounting relationship. Furthermore, though the bonding head 120 makes a circular arc movement as shown in FIG. 9, a complicated mechanisms comprising rotational bearings, etc. is not required for the bonding head 120 itself.

In a typical conventional technique, on the other hand, an X table and Y table are superimposed, and a bonding head is mounted on top of these tables. Accordingly, there may be cases in which the mounting relationship is such that one driving source drives the other table and the driving source of this other table. In other words, in such a conventional technique, the driving source must have an increased driving force; as a result, a high rigidity is required, and the mass, inertia, etc. increase, thus hindering higher moving speed of the bonding head. In the present invention, since the two driving sources are not in a mutual mounting relationship (as described above), the driving force is reduced, and the bonding head is efficiently driven without increasing the rigidity more than necessary, so that high moving speed of the bonding head is assured.

The invention claimed is:

1. A bonding apparatus for semiconductor devices comprising a bonding head, which performs bonding work on an object of bonding, and a moving mechanism, which moves the bonding head to arbitrary positions, said moving mechanism comprising:
a first actuator for directly driving said bonding head, said first actuator comprising a first movable member, which is movable along a first guide groove rotationally provided on a supporting stand, a first movable arm, which is fastened to said first movable member, and a first drive section, which drives said first movable member, and
a second actuator for directly driving said bonding head, said second actuator comprising a second movable member, which is movable along a second guide groove rotationally provided on said supporting stand, a second movable arm, which is fastened to said second movable member, and a second drive section, which drives said second movable member; and wherein
one end of the first movable arm is fastened to the bonding head, and one end of the second movable arm is shaft-supported by the bonding head.

2. The bonding apparatus according to claim 1, wherein the first actuator is structured so that the first drive section and a first linear guide, which guides the first movable member and is comprised of a first guide and the first guide groove, are rotationally provided on the supporting stand as an integral unit, and
the second actuator is structured so that the second drive section and a second linear guide, which guides the second movable member and is comprised of a second guide and the second groove, are rotationally provided on the supporting stand as an integral unit.

3. The bonding apparatus according to claim 1, wherein the first actuator is comprised of said first movable member, which is a first movable coil of a first coil assembly, and said first drive section, which is fastened to the supporting stand and includes a first magnet that provides a first magnetic flux linkage to the first movable coil, and
a size of the first movable coil is set based upon conditions in which an amount of the first magnetic flux linkage with said first magnet, which is applied to the first movable coil by rotational and linear movements of the first movable coil, is free of changing; and
the second actuator is comprised of said second movable member, which is a second movable coil of a second coil assembly, and said second drive section, which is fastened to the supporting stand and includes a second magnet that provides a second magnetic flux linkage to the second movable coil, and
a size of the second movable coil is set based upon conditions in which an amount of the second magnetic flux linkage from said second magnet, which is applied to the second movable coil by rotational and linear movements of the second movable coil, is free of changing.

4. A bonding apparatus for semiconductor devices comprising a bonding head, which performs bonding work on an object of bonding, and a moving mechanism, which moves the bonding head to arbitrary positions, the moving mechanism comprising:
a first actuator for directly driving said bonding head, said first actuator including:
a first movable coil of a first coil assembly, which constitutes a first movable member rotationally provided on a first guide groove member that is movable along a first guide fastened to a supporting stand, a first movable arm fastened to said first movable coil assembly, and a first drive section, which includes a first magnet for providing a first magnetic flux linkage to the first movable coil and is fastened to the supporting stand, wherein a size of the first movable coil is set based upon conditions in which an amount of the first magnetic flux linkage from said first magnet that is applied to the first movable coil by rotational and linear movements of the first movable coil is free of changing; and
a second actuator for directly driving said bonding head, said second actuator including:
a second movable coil of a second coil assembly, which constitutes a second movable member rotationally provided on a second guide groove member that is movable along a second guide fastened to said supporting stand, a second movable arm fastened to said first movable coil assembly, and a second drive section, which includes a second magnet for providing a second magnetic flux linkage to the second movable coil and is fastened to the supporting stand, wherein a size of the second movable coil is set based upon conditions in which an amount of the second magnetic flux linkage from said second magnet that is applied to the second movable coil by rotational and linear movements of the second movable coil is free of changing; and wherein one end of the first movable arm is fastened to the bonding head, and one end of the second movable arm is shaft-supported by the bonding head.

5. The bonding apparatus according to any one of claims 1 through 4, wherein a point where a first straight line and a second straight line intersect is set on substantially the center of gravity of the bonding head, said first straight line connecting a center of rotation of the first movable member and a part of the first movable member at which the first movable arm of the first movable member is connected to the bonding head, and said second straight line connecting a center of rotation of the second movable member and a part of the second movable member at which the second movable arm of the second movable member is connected to the bonding head.

6. The bonding apparatus according to any one of claims 1 through 4, wherein the bonding head is supported on the supporting stand by fluid pressure.

7. The bonding apparatus according to any one of claims 1 through 4, wherein the supporting stand is a fluid pressure supporting stand that supports the bonding head by fluid pressure.

8. The bonding apparatus according to claim 1 or 2, wherein the supporting stand is a suspension supporting stand that supports the bonding head by suspension.

9. The bonding apparatus according to any one of claims 1 through 4, wherein said bonding apparatus comprises:
   a first sensor that detects a position of the first movable member,
   a second sensor that detects a position of the second movable member,
   a position calculating means that calculates a position of the bonding head as a position in an orthogonal coordinate system with respect to the supporting stand based upon detection data of the first sensor and detection data of the second sensor, and
   a control means that performs position control of the bonding head based upon a calculated position in the orthogonal coordinate system.

* * * * *